US008993997B2

(12) United States Patent
Lee et al.

(10) Patent No.: US 8,993,997 B2
(45) Date of Patent: Mar. 31, 2015

(54) LIGHT EMITTING DEVICE HAVING MGO PYRAMID STRUCTURE AND METHOD FOR FABRICATING THE SAME

(75) Inventors: Jong Lam Lee, Pohang-si (KR); Jun Ho Son, Gyeongsan-si (KR); Hak Ki Yu, Andong-si (KR)

(73) Assignees: Seoul Viosys Co., Ltd., Ansan-si (KR); POSTECH Academy-Industry Foundation, Pohang-si (KR)

( * ) Notice: Subject to any disclaimer, the term of this patent is extended or adjusted under 35 U.S.C. 154(b) by 6 days.

(21) Appl. No.: 13/809,052

(22) PCT Filed: Jun. 23, 2011

(86) PCT No.: PCT/KR2011/004592
§ 371 (c)(1),
(2), (4) Date: Mar. 19, 2013

(87) PCT Pub. No.: WO2012/005459
PCT Pub. Date: Jan. 12, 2012

(65) Prior Publication Data
US 2013/0207074 A1 Aug. 15, 2013

(30) Foreign Application Priority Data
Jul. 8, 2010 (KR) .......................... 10-2010-0066021

(51) Int. Cl.
*H01L 33/22* (2010.01)
*H01L 33/02* (2010.01)
(Continued)

(52) U.S. Cl.
CPC ................. *H01L 33/22* (2013.01); *H01L 33/02* (2013.01); *H01L 33/32* (2013.01); *H01L 33/42* (2013.01)
USPC ........................................................ 257/13

(58) Field of Classification Search
CPC ......... H01L 21/00; H01L 33/08; H01L 33/22; H01L 33/46; H01L 33/60; H01L 33/58; H01L 33/62
USPC ........... 257/57, 59, 66, 72, 95, 294, 359, 382, 257/383, 385, 388, 390, 412, 413, 4, 43, 257/456, 576, 757, 768, E21.006, E21.53, 257/E21.411, E21.412, E51.005, E29.151, 257/E27.1, E29.117, E33.073; 438/30, 149, 438/158–159, 582, 583, 648, 656, 683, 685, 438/785
See application file for complete search history.

(56) References Cited

U.S. PATENT DOCUMENTS

| 2002/0195609 A1* | 12/2002 | Yoshitake et al. ............... 257/81 |
| 2003/0025212 A1* | 2/2003 | Bhat et al. ...................... 257/780 |

(Continued)

FOREIGN PATENT DOCUMENTS

| JP | 2007-281037 | 10/2007 |
| KR | 10-2005-0036379 | 4/2005 |

(Continued)

OTHER PUBLICATIONS

International Search Report dated Feb. 29, 2012 issued for related International Application No. PCT/KR2011/004592.

*Primary Examiner* — Fernando L Toledo
*Assistant Examiner* — Lawrence-Linh T Nguyen
(74) *Attorney, Agent, or Firm* — H.C. Park & Associates, PLC

(57) ABSTRACT

A gallium nitride-based group III-V compound semiconductor light emitting device and a method for fabricating the same are provided. The gallium nitride-based group III-V compound semiconductor light emitting device includes: a substrate; a p-type ohmic electrode layer formed on the substrate; a p-type gallium nitride-based group III-V compound semiconductor layer formed on the p-type ohmic electrode layer; an n-type gallium nitride-based group III-V compound semiconductor layer formed on the p-type gallium nitride-based group III-V compound semiconductor layer; an n-type ohmic electrode layer formed on the n-type gallium nitride-based group III-V compound semiconductor layer; and first and second refractive index adjustment layers having refractive index smaller than those of the n-type gallium nitride-based group III-V compound semiconductor layer and the n-type ohmic electrode layer, wherein a pyramid structure is formed on the surface of the second refractive index adjustment layer.

11 Claims, 4 Drawing Sheets

(51) Int. Cl.
*H01L 33/32* (2010.01)
*H01L 33/42* (2010.01)

(56) References Cited

U.S. PATENT DOCUMENTS

2005/0082557 A1 4/2005 Seong et al.

2007/0018183 A1 1/2007 Denbaars et al.
2011/0062467 A1 3/2011 Song

FOREIGN PATENT DOCUMENTS

KR 10-2008-0035648 4/2008
KR 10-2009-0101604 9/2009

* cited by examiner

LIGHT EMITTING DEVICE HAVING MGO PYRAMID STRUCTURE AND METHOD FOR FABRICATING THE SAME

CROSS-REFERENCE TO RELATED APPLICATIONS

This application is the National Stage of International Application No. PCT/KR2011/004592, filed on Jun. 23, 2011, and claims priority to and the benefit of Korean Patent Application No. 10-2010-0066021, filed on Jul. 8, 2010, which are incorporated herein by reference for all purposes as if fully set forth herein.

BACKGROUND

1. Field

The present invention relates to technology for improving light output of a gallium nitride-based vertical light emitting diode, and more particularly, to a gallium nitride-based vertical light emitting diode, which improves light output by providing a refractive index adjustment layer and an MgO pyramid structure on an n-type semiconductor layer, and a method for fabricating the same.

2. Discussion of the Background

A gallium nitride-based light emitting diode, which is used as a white light source, has high energy conversion efficiency, long lifespan and high light orientation, can be driven with a low voltage, requires no preheating time and complicated driving circuit, and is resistant against shock and vibration, making it possible to implement various types of high-class lighting system. Therefore, the gallium nitride-based light emitting diode is expected as a light source for solid-state lighting, which will replace the existing light sources, such as incandescent lamp, fluorescent lamp, and mercury lamp, in the near future. However, in order to use the gallium nitride-based light emitting diode as the white light source in replacement of the existing mercury lamp or fluorescent lamp, the gallium nitride-based light emitting diode must have excellent thermal stability and must be able to emit high-power light even at low power consumption.

A gallium nitride-based horizontal light emitting diode, which has been widely used as a white light source at present, has an advantage in that its fabricating cost is relatively low and its fabricating process is simple, but has a fundamental drawback in that it is inappropriate for use as a large-area high-power light source having a high applied current. A vertical light emitting diode is a device that overcomes the drawback of the horizontal light emitting diode and is easily applicable to a large-area high-power light emitting diode.

The vertical light emitting diode has many advantages as compared with the existing horizontal light emitting diode. Specifically, the vertical light emitting diode can obtain a very uniform current diffusion due to its small current diffusion resistance. Thus, the vertical light emitting diode can obtain a lower operating voltage and a high light output. Since the vertical light emitting diode can discharge heat through a metal or semiconductor substrate having excellent thermal conductivity, the lifespan of the device can be extended and the significantly improved high-power operation can be carried out.

In such a vertical light emitting diode, a maximum applied current is increased about 3-4 times or more as compared with the horizontal light emitting diode. Therefore, it is highly likely that the vertical light emitting diode will be used as the white light source for lighting. In practice, many companies have conducted extensive research and development for commercialization and performance improvement of the vertical light emitting diode, and some companies are selling related products.

On the other hand, in the fabricating of the gallium nitride-based vertical light emitting diode, a portion that can significantly improve light output of the device is an n-type semiconductor layer disposed in an upper portion of the device. However, when the n-type semiconductor layer is a smooth flat surface, a total reflection occurs in the interface of the atmosphere and the semiconductor layer due to a large difference in refractive index between the n-type semiconductor layer and the atmosphere (refractive index of the n-type semiconductor layer=about 2.5, refractive index of the atmosphere=1). A considerable part of light generated in an active layer cannot exit to the exterior. Consequently, high light output cannot be expected. Therefore, it is necessary to prevent the occurrence of the total reflection by artificially deforming the surface of the semiconductor layer, so as to exit light to the exterior with minimum loss.

SUMMARY OF THE INVENTION

An aspect of the present invention is directed to provide a method for fabricating a light emitting device that is applicable without excessively modifying a conventional process for fabricating a gallium nitride-based light emitting diode, and to provide a light emitting device that increases light output of a light emitting diode as compared with a conventional gallium nitride-based group III-V compound semiconductor light emitting diode.

According to an embodiment of the present invention, a light emitting device comprises, a substrate; a first semiconductor layer, a second semiconductor layer, and an active layer disposed therebetween, which are formed on the substrate; and a refractive index adjustment layer formed on the first semiconductor layer and having a refractive index smaller than a refractive index of the first semiconductor layer.

The refractive index adjustment layer may comprises, a first refractive index adjustment layer formed on the first semiconductor layer and having a refractive index smaller than the refractive index of the first semiconductor layer; and a second refractive index adjustment layer formed on the first refractive index adjustment layer and having a refractive index lower than a refractive index of the first refractive index adjustment layer, wherein the second refractive index adjustment layer comprises a pyramid structure.

The first semiconductor layer may be formed of a nitride-based semiconductor layer, and the first refractive index adjustment layer may be formed of a ZnO-based semiconductor oxide layer.

The second refractive index adjustment layer may be formed of MgO-based oxide, and the MgO-based oxide may comprise a ternary or multicomponent compound formed by adding other elements to MgO.

The ternary compound may comprise $Mg_xBe_{1-x}O$, $Mg_xCa_{1-x}O$, $Mg_xSr_{1-x}O$, and $Mg_xBa_{1-x}O$, and the multicomponent compound is a compound of Mg and two or more of Be, Ca, Sr, and Ba.

The MgO-based oxide may be an impurity-doped MgO-based oxide, and the impurity may comprise a metal including at least one selected from the group of B, In, Zn, Tl, Al, Sn, Ga, Te, Si, C, Ge, N, P, As, Sb, Bi, S, Se, Br, I, and Ti, or an oxide thereof, or a mixture of the metal and the oxide thereof.

The first refractive index adjustment layer may comprise at least one of the group of ZnO, Al-doped ZnO, In-doped ZnO, Ga-doped ZnO, $ZrO_2$, $TiO_2$, $SiO_2$, SiO, $Al_2O_3$, $CuO_x$, and ITO.

The first semiconductor layer may be an n-type semiconductor layer.

The light emitting device may further comprise, a transparent ohmic electrode layer disposed on the first semiconductor layer, wherein the refractive index adjustment layer may be disposed on the transparent ohmic electrode layer.

According to another embodiment of the present invention, a method for fabricating a light emitting device may include: preparing a conductive substrate; forming a semiconductor stack structure comprising a first semiconductor layer, a second semiconductor layer, and an active layer disposed therebetween on the substrate; and forming a refractive index adjustment layer on the first semiconductor layer, wherein the refractive index adjustment layer has a refractive index smaller than a refractive index of the first semiconductor layer.

The refractive index adjustment layer may include: a first refractive index adjustment layer formed on the first semiconductor layer and having a refractive index smaller than the refractive index of the first semiconductor layer; and a second refractive index adjustment layer formed on the first refractive index adjustment layer and having a refractive index smaller than the refractive index of the first refractive index adjustment layer, wherein the second refractive index adjustment layer comprises a pyramid structure.

According to the present invention, it is possible to prevent an occurrence of total reflection in an interface between a semiconductor layer of a light emitting diode and air, and it is possible to improve light extraction efficiency. Therefore, light output of the light emitting diode can be significantly improved as comparing with the prior art.

In addition, according to the present invention, a refractive index adjustment layer having a pyramid structure can be formed without additional process for forming roughness on a surface of a semiconductor layer. Therefore, it is possible to instantly apply to a conventional fabricating process of a gallium nitride-based light emitting diode. It is possible to apply to a vertical light emitting diode and a horizontal light emitting diode as well, which is relatively difficult to form a pyramid structure on a surface. Moreover, since the present invention is applicable to a large area wafer process, it is very effective in terms of the reduction of fabricating costs.

DETAILED DESCRIPTION OF THE ILLUSTRATED EMBODIMENTS

Figure 1:
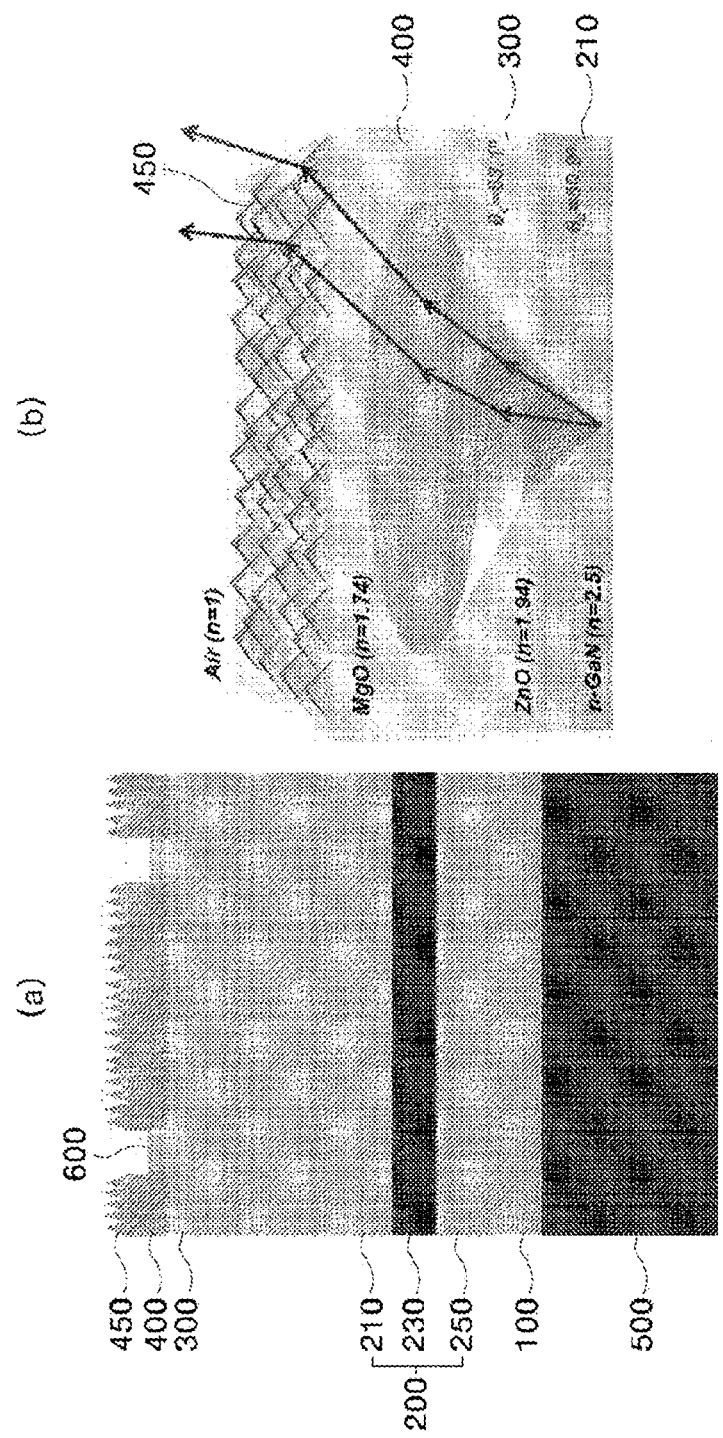
FIG. 1A is a cross-sectional view of a gallium nitride-based vertical light emitting diode according to an embodiment of the present invention, comprising a first refractive index adjustment layer and a second refractive index adjustment layer including a pyramid structure.
FIG. 1B is a diagram describing the improvement of light output by the first and second refractive index adjustment layers.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like elements throughout this disclosure.

Figure 2:
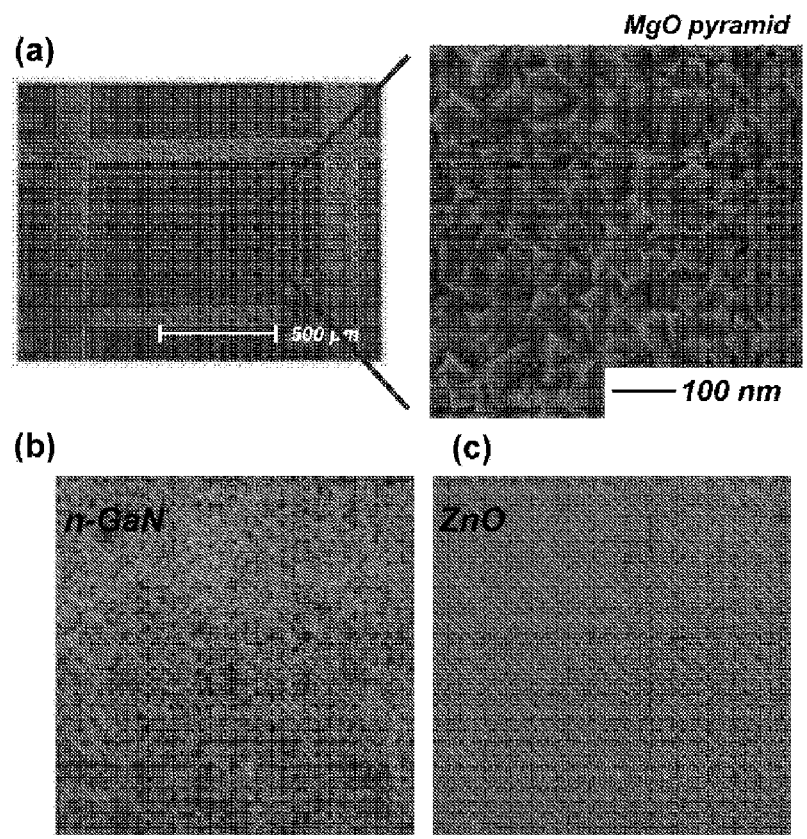
FIG. 2A is a scanning electron microscope (SEM) image showing the gallium nitride-based vertical light emitting diode according to the embodiment of the present invention and a MgO pyramid structure formed on the surface of the vertical light emitting diode.
FIG. 2B is a SEM image showing a flat surface of an n-type gallium nitride-based semiconductor layer.
FIG. 2C is a SEM image showing a surface of a ZnO layer.
Figure 3:
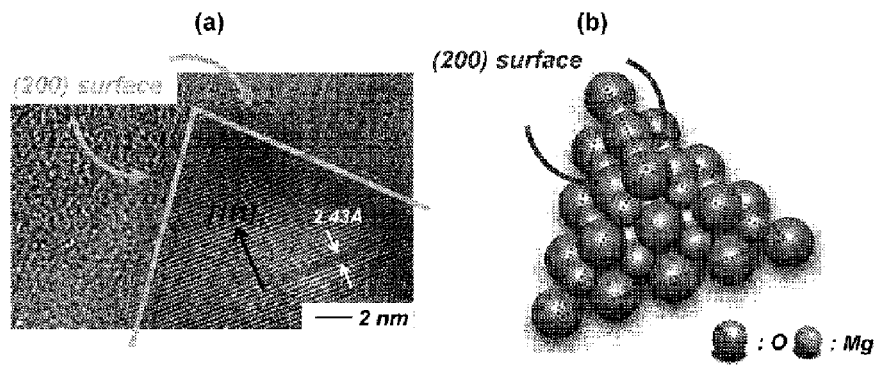
FIG. 3A is a high-resolution transmission electron microscope (TEM) image showing the MgO pyramid structure according to the embodiment of the present invention.
FIG. 3B is a diagram schematically illustrating a crystal structure of the MgO pyramid.

Hereinafter, a structure of a light emitting device according to an embodiment of the present invention will be described in detail with reference to FIGS. 1 to 3.

FIG. 1A is a cross-sectional view illustrating a structure of a gallium nitride-based vertical light emitting diode according to an embodiment of the present invention, including a first refractive index adjustment layer 300 and a second refractive index adjustment layer 400 including a pyramid structure 450, and FIG. 1B is a diagram describing the improvement of light output by the first and second refractive index adjustment layers 300 and 400.

Referring to FIG. 1A, the gallium nitride-based vertical light emitting diode according to the present invention may includes a substrate 500, a p-type ohmic electrode layer 100, a semiconductor stack structure 200, a first refractive index adjustment layer 300, a second refractive index adjustment layer 400, and an n-type electrode pad 600. The semiconductor stack structure 200 includes an n-type semiconductor layer 210, an active layer 230, and a p-type semiconductor layer 250. The first refractive index adjustment layer 300 and the second refractive index adjustment layer 400 are formed on the semiconductor stack structure 200.

Since elements other than the first and second refractive index adjustment layers 300 and 400 are not different from the structure of the conventional vertical light emitting diode, the first and second refractive index adjustment layers 300 and 400 will be described below in detail.

According to the embodiment of the present invention, the first refractive index adjustment layer 300 and the second refractive index adjustment layer 400 having refractive index values which are between the refractive index of the gallium nitride-based semiconductor layer (n=about 2.5) and the refractive index of air (n=1) may be formed on the n-type semiconductor layer 210 so as to increase a critical angle for emitting light into the air by adjusting the refractive index.

In addition, the first refractive index adjustment layer 300 is formed on the n-type semiconductor layer 210 and is a ZnO-based thin-film layer having a refractive index (for example, n=1.94) lower than that of the n-type semiconductor layer 210. The first refractive index adjustment layer 300 may comprises at least one selected from the group of ZnO, Al-doped ZnO, In-doped ZnO, Ga-doped ZnO, $ZrO_2$, $TiO_2$, $SiO_2$, SiO, $Al_2O_3$, $CuO_x$ and ITO, but the present invention is not limited thereto. However, for simplicity of description, the first refractive index adjustment layer 300 will be simply referred to as a ZnO (refractive index adjustment) layer.

In addition, the second refractive index adjustment layer 400 is formed on the first refractive index adjustment layer 300 and has a refractive index (for example, n=1.74) lower than that of the first refractive index adjustment layer 300. For example, the second refractive index adjustment layer 400 may be formed of MgO-based oxide. The MgO-based oxide may comprise ternary or multicomponent compound formed by adding other elements to MgO.

Examples of the ternary compound include $Mg_xBe_{1-x}O$, $Mg_xCa_{1-x}O$, $Mg_xSr_{1-x}O$, and $Mg_xBa_{1-x}O$, but the present invention is not limited thereto. The multicomponent compound may be a compound of Mg and two or more of Be, Ca, Sr, and Ba, but the present invention is not limited thereto.

In addition, the MgO-based oxide may be formed by doping impurity into any MgO-based oxide, and there is no limitation to the impurity. For example, the impurity may be a metal comprising at least one selected from the group of B, In, Zn, Tl, Al, Sn, Ga, Te, Si, C, Ge, N, P, As, Sb, Bi, S, Se, Br, I, and Ti, or an oxide thereof, or a mixture of the metal and the oxide thereof. However, for simplicity of description, the second refractive index adjustment layer 400 will be simply referred to as an MgO (refractive index adjustment) layer.

In addition, according to the present invention, the first and second refractive index adjustment layers 300 and 400 may be formed on the n-type semiconductor layer 210. According to some embodiments, the first and second refractive index adjustment layers 300 and 400 may be formed on a transparent n-type ohmic electrode layer (not illustrated) that is formed on the n-type semiconductor layer 210. In this case, the first and second refractive index adjustment layers 300 and 400 have a refractive index smaller than that of the n-type ohmic electrode layer, and the second refractive index adjustment layer 400 may comprise a pyramid structure formed on the surface thereof.

In addition, according to the present invention, the first and second refractive index adjustment layers 300 and 400 need not be necessarily formed together. Only one of the first and second refractive index adjustment layers 300 and 400 having the refractive index lower than that of the n-type semiconductor layer 210 may be formed on the n-type semiconductor layer 210, and the first and second refractive index adjustment layers 300 and 400 may be sequentially stacked as illustrated in FIG. 1. For example, the effect obtained when only the first refractive index adjustment layer 300 is formed can be seen from FIGS. 4 and 5. However, the following description will focus on the case where both of the first and second refractive index adjustment layers 300 and 400 are formed.

Referring to FIG. 1B, according to the embodiment of the present invention, a critical angle between the n-type semiconductor layer 210 and the first refractive index adjustment layer 300 is, for example, about 50.9° greater than 23.6°, which is the critical angle between the n-type semiconductor layer 210 and the air. The critical angle between the first refractive index adjustment layer 300 and the second refractive index adjustment layer 400 is, for example, about 63.1°, which is a further increased value.

FIG. 2A is a scanning electron microscope (SEM) image showing the gallium nitride-based vertical light emitting diode according to the embodiment of the present invention and the pyramid structure of the MgO refractive index adjustment layer 400 formed on the surface of the vertical light emitting diode, FIG. 2B is a SEM image showing the flat surface of the n-type semiconductor layer 210, and FIG. 2C is a SEM image showing the surface of the ZnO refractive index adjustment layer 300.

It can be seen from FIG. 2A that the pyramid structure 450 is successfully formed on the surface of the second refractive index adjustment layer 400. On the other hand, since it can be confirmed from FIGS. 2B and 2C that the n-type semiconductor layer 210 and the ZnO refractive index adjustment layer 300 have the flat surface, it can be seen that the pyramid structure 450 of the refractive index adjustment layer according to the embodiment of the present invention can be formed on the second refractive index adjustment layer 400.

FIG. 3A is a high-resolution transmission electron microscope (TEM) image showing the MgO pyramid structure 450 according to the embodiment of the present invention, and FIG. 3B is a diagram schematically illustrating a crystal structure of the MgO pyramid structure 450.

It can be seen from the TEM image of FIG. 3A that the MgO pyramid structure 450 is ended with (200) crystal plane and has a growth direction of (111) crystal plane. In the MgO layer having the rock salt structure, the (200) crystal plane has lower surface energy than the (111) crystal plane. Therefore, this can be described as a spontaneous process for reducing energy of a thin film during a deposition process.

That is, according to the embodiment of the present invention, the pyramid structure 450 can be formed on the surface of the second refractive index adjustment layer 400 during the deposition process without additional process. Therefore, according to the present invention, a large amount of light incident on the second refractive index adjustment layer 400 is scattered and discharged into the air by the pyramid structure 450 of the second refractive index adjustment layer 400, without greatly modifying the conventional method for fabricating the light emitting device.

Hereinafter, the light output characteristic of the light emitting device according to the present invention will be described with reference to FIGS. 4 to 6.

Figure 4:
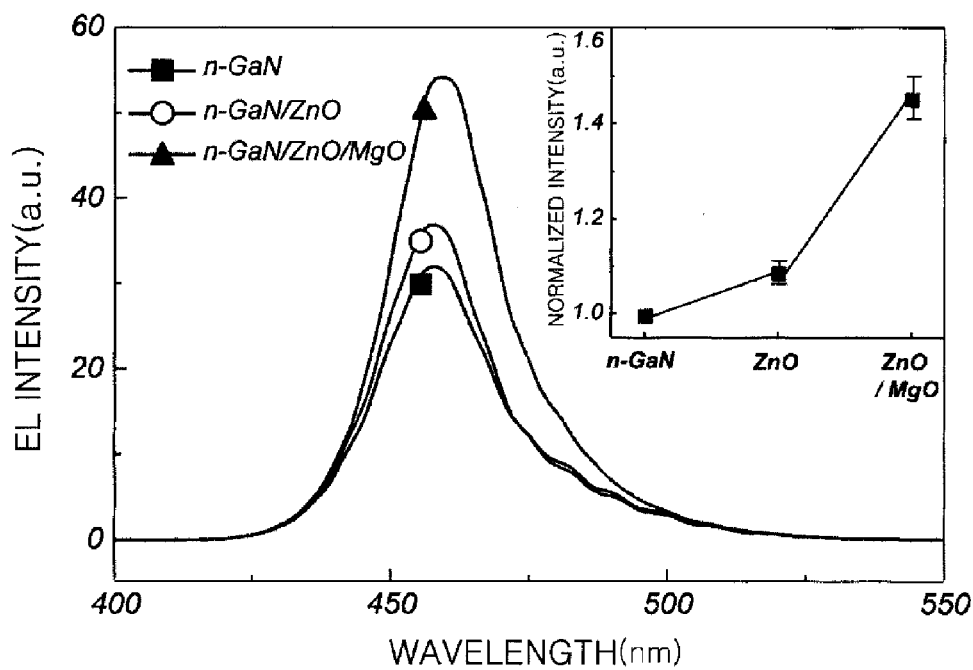
FIG. 4 is a diagram illustrating an electroluminescence (EL) spectrum of a gallium nitride-based vertical light emitting diode according to an embodiment of the present invention, including a ZnO refractive index adjustment layer and an MgO refractive index adjustment layer with a pyramid structure.

FIG. 4 is a diagram illustrating an electroluminescence (EL) spectrum of the gallium nitride-based vertical light emitting diode according to the embodiment of the present invention, including the ZnO refractive index adjustment layer 300 and the MgO adjustment layer 400 with the pyramid structure 450.

On the other hand, for comparison in the graph of FIG. 4, the EL spectrum of the vertical light emitting diode including the ZnO refractive index adjustment layer 300 and the MgO refractive index adjustment layer 400 is illustrated together with the case of the conventional vertical light emitting diode including the n-type semiconductor layer with the flat surface and the case of the vertical light emitting diode including only the flat ZnO refractive index adjustment layer 300 (that is, the first refractive index adjustment layer) on the n-type semiconductor layer 210.

It can be seen from FIG. 4 that the light output is improved by the increased critical angle when the ZnO refractive index adjustment layer 300 is included on the n-type semiconductor layer 210, as compared with the conventional vertical light emitting diode including the n-type semiconductor layer with the flat surface. Also, it can be seen that the light output of the light emitting diode is further improved up to 1.5 times when both of the ZnO refractive index adjustment layer 300 and the MgO refractive index adjustment layer 400 are included.

The ZnO and MgO refractive index adjustment layers 300 and 400 and the MgO pyramid structure 450 according to the embodiment of the present invention can be manufactured using general optical lithography patterning, without using E-beam lithography patterning that is high in fabricating cost and is difficult to apply to a large-area wafer process.

Although not limited, for example, the ZnO and MgO refractive index adjustment layers 300 and 400 may be formed on only the surface of the n-type semiconductor layer 210 a method including, forming a photoresist (PR) pattern using optical lithography, depositing ZnO and MgO refractive index adjustment layers 300 and 400, and removing the PR using a lift-off process using acetone. This method is very effective in terms of the application to the large area and the fabricating cost because the pyramid structure 450 can be formed without separate additional processes.

Figure 5:
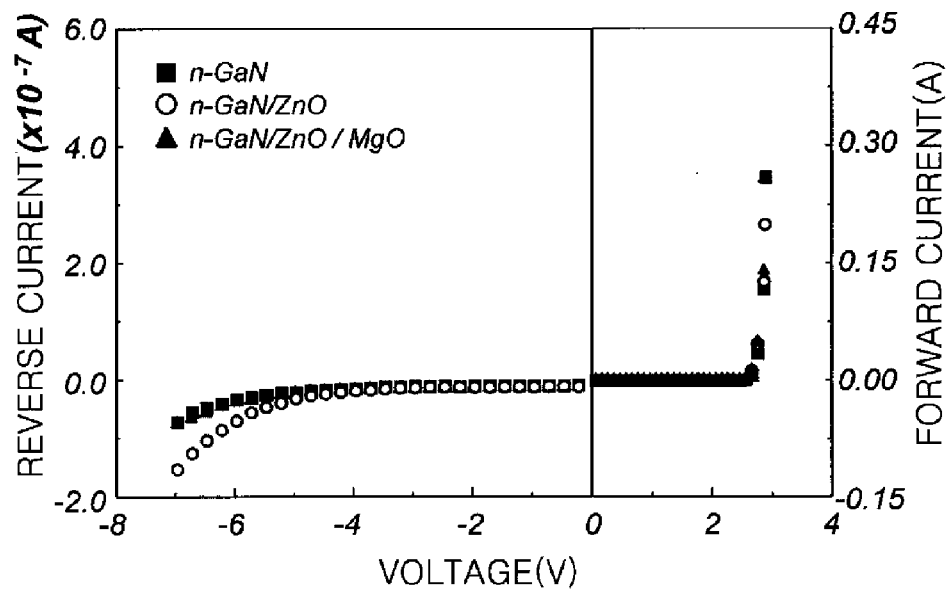
FIG. 5 is a diagram illustrating a current-voltage curve of the gallium nitride-based vertical light emitting diode according to the embodiment of the present invention, including the ZnO refractive index adjustment layer and the MgO refractive index adjustment layer with the pyramid structure.
Figure 6:
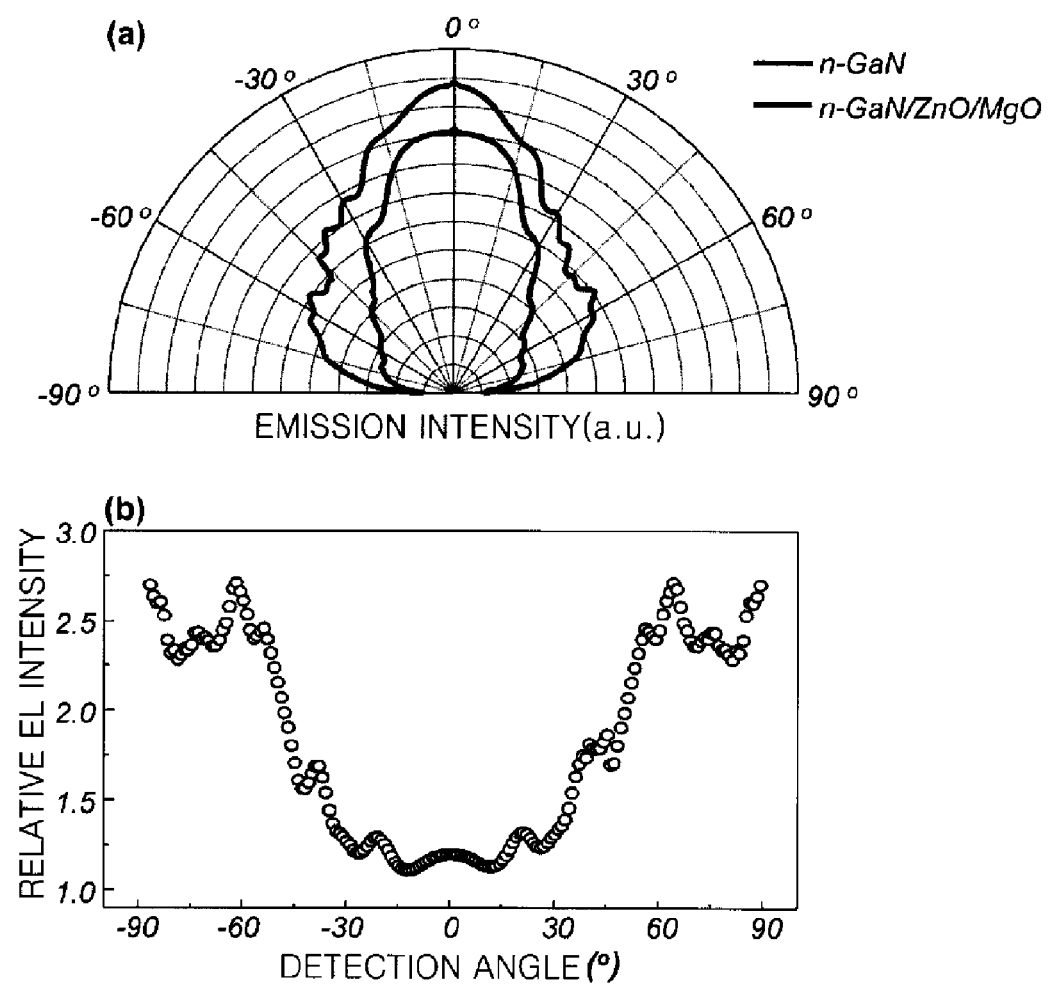
FIG. 6A is a diagram illustrating two-dimensional light distribution characteristics of the gallium nitride-based vertical light emitting diode according to the embodiment of the present invention, including the ZnO refractive index adjustment layer and the MgO refractive index adjustment layer with the pyramid structure, and the conventional vertical light emitting diode having the flat surface of the n-type gallium nitride-based semiconductor.
FIG. 6B is a diagram illustrating light output improvement characteristic with respect to an angle according to the present invention.

FIG. 5 is a diagram illustrating a current-voltage curve of the gallium nitride-based vertical light emitting diode according to the embodiment of the present invention, including the ZnO refractive index adjustment layer 300 and the MgO adjustment layer 400 with the pyramid structure 450.

For comparison, in the graph of FIG. 5, the current-voltage curve of the vertical light emitting diode including the ZnO refractive index adjustment layer 300 and the MgO refractive index adjustment layer 400 is illustrated together with the case of the conventional vertical light emitting diode including the n-type semiconductor layer with the flat surface and the case of the vertical light emitting diode including only the flat ZnO refractive index adjustment layer 300 (that is, the first refractive index adjustment layer) on the n-type semiconductor layer 210.

It can be seen from FIG. 5 that the electrical characteristic of the light emitting diode is not degraded even when the ZnO refractive index adjustment layer 300 and the MgO refractive index adjustment layer 400 are formed according to the embodiment of the present invention.

FIG. 6A is a diagram illustrating two-dimensional light distribution characteristics of the gallium nitride-based vertical light emitting diode according to the embodiment of the present invention, including the ZnO refractive index adjustment layer 300 and the MgO refractive index adjustment layer 400 with the MgO pyramid structure 450, and the conventional vertical light emitting diode including the n-type gallium nitride-based semiconductor with the flat surface, and FIG. 6B is a diagram illustrating the light output improvement characteristic with respect to the angle according to the present invention.

Referring to FIG. 6A, since the conventional vertical light emitting diode including the n-type semiconductor layer with the flat surface has a small critical angle of about 23.6°, the light output is greatly exhibited in a direction perpendicular to the surface of the n-type semiconductor layer, and the light output is rapidly reduced as it goes toward the side. On the contrary, according to the embodiment of the present invention, in the case of the vertical light emitting diode including the ZnO refractive index adjustment layer 300 and the MgO refractive index adjustment layer 400 including the MgO pyramid 450, the light output is greatly increased at the side and light in the direction of refraction is also increased. Also, this can be confirmed from the graph according to the detection angle by FIG. 6B.

Therefore, as described above, according to the embodiment of the present invention, in the case where the first refractive index adjustment layer 300 and the second refractive index adjustment layer 400 are formed on the n-type semiconductor layer 210 and the second refractive index adjustment layer 400 has the pyramid structure 450, the light output characteristic and light distribution characteristic of the gallium nitride-based vertical light emitting diode can be improved.

While the present invention has been described with respect to the specific embodiments, it will be apparent to those skilled in the art that various changes and modifications may be made without departing from the spirit and scope of the invention as defined in the following claims. Therefore, it is to be understood that the foregoing is illustrative of various exemplary embodiments of the invention and is not to be construed as limited to the specific embodiments disclosed, are intended to be included within the scope of the appended claims.

The invention claimed is:

1. A light emitting device comprising:
   a substrate;
   a first semiconductor layer, a second semiconductor layer, and an active layer disposed therebetween, arranged on the substrate; and
   a refractive index adjustment layer disposed directly on the first semiconductor layer and not directly on the second semiconductor layer or the active layer, the refractive index adjustment layer having a refractive index that is smaller than a refractive index of the first semiconductor layer.

2. The light emitting device of claim 1, wherein the refractive index adjustment layer comprises:
   a first refractive index adjustment layer disposed on the first semiconductor layer, the first refractive index adjustment layer having a refractive index that is smaller than the refractive index of the first semiconductor layer; and
   a second refractive index adjustment layer disposed on the first refractive index adjustment layer, the second refractive index adjustment layer having a refractive index that is smaller than the refractive index of the first refractive index adjustment layer,
   wherein the second refractive index adjustment layer comprises a pyramid structure.

3. The light emitting device of claim 2, wherein the first semiconductor layer comprises a nitride-based semiconductor layer, and the first refractive index adjustment layer comprises a ZnO-based semiconductor oxide.

4. The light emitting device of claim 2, wherein the second refractive index adjustment layer comprises a ternary MgO-based compound, or a multicomponent MgO-based compound comprising MgO and at least two other elements.

5. The light emitting device of claim 4, wherein the ternary MgO-based compound comprises $Mg_xBe_{1-x}O$, $Mg_xCa_{1-x}O$, $Mg_xSr_{1-x}O$, or $Mg_xBa_{1-x}O$, and
   wherein the multicomponent MgO-based compound comprises two or more of Be, Ca, Sr, and Ba.

6. The light emitting device of claim 4, wherein the ternary MgO-based compound or the multicomponent MgO-based compound is doped with an impurity, the impurity comprising at least one of B, In, Zn, Tl, Al, Sn, Ga, Te, Si, C, Ge, N, P, As, Sb, Bi, S, Se, Br, I, Ti, and an oxide thereof.

7. The light emitting device of claim 2, wherein the first refractive index adjustment layer comprises at least one of ZnO, Al-doped ZnO, In-doped ZnO, Ga-doped ZnO, $ZrO_2$, $TiO_2$, $SiO_2$, SiO, $Al_2O_3$, $CuO_x$, and indium tin oxide (ITO).

8. The light emitting device of claim 1, wherein the first semiconductor layer comprises an n-type semiconductor layer.

9. The light emitting device of claim 1, further comprising a transparent ohmic electrode layer disposed on the first semiconductor layer,
   wherein the refractive index adjustment layer is disposed on the transparent ohmic electrode layer.

10. The light emitting device of claim 1, wherein refractive indices of the first semiconductor layer and each layer disposed on the first semiconductor layer sequentially decrease in a direction extending away from the first semiconductor layer.

11. The light emitting device of claim 1, wherein the refractive index adjustment layer comprises:
   a first refractive index adjustment layer disposed on the first semiconductor layer, the first refractive index adjustment layer having a refractive index that is smaller than the refractive index of the first semiconductor layer; and
   a second refractive index adjustment layer disposed on the first refractive index adjustment layer, the second refractive index adjustment layer having a refractive index that is smaller than the refractive index of the first refractive index adjustment layer,
   wherein the second refractive index adjustment layer comprises a pyramid structure exposed to ambient air.

* * * * *